(12) United States Patent
Song et al.

(10) Patent No.: US 8,530,910 B2
(45) Date of Patent: *Sep. 10, 2013

(54) ORGANIC LIGHT EMITTING DISPLAY DEVICE INCLUDING TRANSMITTING REGIONS BETWEEN PIXEL REGIONS

(75) Inventors: Young-Woo Song, Yongin (KR); Jong-Hyuk Lee, Yongin (KR); Chaun-Gi Choi, Yongin (KR); Kyu-Hwan Hwang, Yongin (KR); Seok-Gyu Yoon, Yongin (KR); Jae-Heung Ha, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 299 days.

This patent is subject to a terminal disclaimer.

(21) Appl. No.: 13/010,257

(22) Filed: Jan. 20, 2011

(65) Prior Publication Data

US 2011/0175097 A1 Jul. 21, 2011

(30) Foreign Application Priority Data

Jan. 21, 2010 (KR) .......................... 10-2010-0005748

(51) Int. Cl.
*H01L 27/14* (2006.01)
*H01J 1/62* (2006.01)

(52) U.S. Cl.
USPC ........ 257/88; 257/72; 257/E33.064; 313/500; 313/505

(58) Field of Classification Search
USPC .............. 257/88, 72, E33.064; 313/500, 505
See application file for complete search history.

(56) References Cited

U.S. PATENT DOCUMENTS 5,739,545 A 4/1998 Guha et al.
6,765,641 B1 7/2004 Kubo et al.
(Continued)

FOREIGN PATENT DOCUMENTS

JP 11-004003 A 1/1999
JP 2005-331665 A 12/2005
(Continued)

OTHER PUBLICATIONS

Japanese Office Action in JP 2010-153114, dated Mar. 21, 2012 (Song, et al.).

(Continued)

*Primary Examiner* — Minh-Loan T Tran
(74) *Attorney, Agent, or Firm* — Lee & Morse, P.C.

(57) ABSTRACT

A transparent organic light emitting display device having an improved transmittance, in which transmittance of external light is increased, the organic light emitting display device including: a substrate having transmitting regions interposed between pixel regions; thin film transistors positioned on a first surface of the substrate and respectively disposed in the pixel regions of the substrate; a passivation layer covering thin film transistors; pixel electrodes formed on the passivation layer and respectively electrically connected to the thin film transistors, the pixel electrodes are respectively located in an area corresponding to the pixel regions, and are disposed to respectively overlap and cover the thin film transistors; an opposite electrode facing the pixel electrodes and formed to be able to transmit light, the opposite electrode is located in the transmitting regions and the pixel regions and includes a first opening formed on a location corresponding to at least a portion of respective ones of the transmitting regions; and an organic emission layer interposed between respective ones of the pixel electrodes and the opposite electrode to emit light.

31 Claims, 8 Drawing Sheets

(56) References Cited

U.S. PATENT DOCUMENTS

| | | |
|---|---|---|
| 7,268,488 B2 | 9/2007 | Ryu |
| 8,274,090 B2 * | 9/2012 | Choi et al. .................. 257/88 |
| 2002/0072139 A1 | 6/2002 | Kashiwabara |
| 2003/0197179 A1 | 10/2003 | Yamazaki et al. |
| 2004/0000863 A1 | 1/2004 | Miyake |
| 2008/0136317 A1 | 6/2008 | Rogojevic et al. |
| 2009/0209068 A1 | 8/2009 | Chang et al. |
| 2011/0169720 A1 * | 7/2011 | Hwang et al. .................. 345/76 |

FOREIGN PATENT DOCUMENTS

| | | |
|---|---|---|
| JP | 2005-331687 A | 12/2005 |
| JP | 2006-128241 A | 5/2006 |
| JP | 2008-112112 A | 5/2008 |
| JP | 2009-237573 A | 10/2009 |
| KR | 10-0286498 B1 | 1/2001 |
| KR | 10-2006-0041797 A | 5/2006 |
| KR | 10-2006-0047075 A | 5/2006 |
| KR | 10-2007-0121619 A | 12/2007 |
| KR | 10-2009-0087500 A | 8/2009 |
| KR | 10-2009-0088575 A | 8/2009 |

OTHER PUBLICATIONS

Korean Notice of Allowance in KR 10-2010-0005748, dated Oct. 27, 2011 (Song, et al.).

* cited by examiner

ORGANIC LIGHT EMITTING DISPLAY DEVICE INCLUDING TRANSMITTING REGIONS BETWEEN PIXEL REGIONS

CROSS-REFERENCE TO RELATED APPLICATION

This application claims the benefit of Korean Patent Application No. 10-2010-0005748, filed Jan. 21, 2010, in the Korean Intellectual Property Office, the disclosure of which is incorporated herein by reference.

BACKGROUND

1. Field

Aspects of the present invention relate to an organic light emitting display device, and more particularly, to a transparent organic light emitting display device.

2. Description of the Related Art

Applications of organic light emitting display devices range from personal portable devices such as MP3 players and mobile phones to television sets due to the organic light emitting display devices having superior characteristics such as wide viewing angles, high contrast ratios, short response times, and low power consumption.

The organic light emitting display device has self-light emitting characteristics, and weight and thickness of the organic light emitting display device can be reduced since the organic light emitting display device does not require an additional light source, unlike a liquid crystal display device. Also, an organic light emitting display device can be formed to be a transparent display device by having transparent thin film transistors (TFTs) and transparent organic light emitting devices.

In a transparent display device, when the device is in an off-state, an object or an image positioned on a side of the device opposite to the user is transmitted to the user through not only organic light emitting diodes but also through patterns of thin film transistors and various wires and through spaces between the patterns of TFTs and various wires. Even in the transparent display device, transmittances of the above-described organic light emitting diodes, the thin film transistors, and the wires are not so high, and spaces between the organic light emitting diodes, the TFT, and the wires are very small and thus, the transmittance of the transparent display device is not high.

Also, a distorted image is transmitted to the user due to the above-described patterns, i.e., the patterns of the organic light emitting diodes, the TFTs, and the wires. The reason for this is because gaps between the patterns are only a few nanometers, that is, at a level almost close to the wavelengths of visible light, and thus, the gaps scatter light therethrough.

SUMMARY OF THE INVENTION

Aspects of the present invention provide a transparent organic light emitting display device having an improved transmittance. Also, aspects of the present invention also provide a transparent organic light emitting display device that prevents distortion of an image transmitted therethrough by preventing light transmitting therethrough from scattering.

According to aspects of the present invention, there is provided an organic light emitting display device including: a substrate having transmitting regions interposed between pixel regions of the substrate; thin film transistors positioned on a first surface of the substrate and respectively disposed in the pixel regions of the substrate; a passivation layer covering the thin film transistors; pixel electrodes formed on the passivation layer and respectively electrically connected to the thin film transistors, the pixel electrodes are respectively located in an area corresponding to the pixel regions and are disposed to respectively overlap and cover the thin film transistors; an opposite electrode facing the pixel electrodes and formed to be able to transmit light, the opposite electrode is located in the transmitting regions and the pixel regions and includes first openings formed on locations corresponding to at least a portion of respective ones of the transmitting regions; and an organic emission layer interposed between respective ones of the pixel electrodes and the opposite electrode to emit light.

According to another aspect of the present invention, there is provided an organic light emitting display device including: a substrate having transmitting regions interposed between pixel regions of the substrate; pixel circuit units formed on a first surface of the substrate in the pixel regions, respectively, each of the pixel circuit units includes at least one thin film transistor; a first insulating layer covering the pixel circuit units; pixel electrodes formed on the first insulating layer and respectively electrically connected to the pixel circuit units while overlapping and covering the pixel circuit units respectively; an opposite electrode facing the pixel electrodes and formed to be able to transmit light, the opposite electrode is located in the transmitting regions and the pixel regions and includes first opening formed on locations corresponding to at least a portion of respective ones of the transmitting regions; and an organic emission layer interposed between respective ones of the pixel electrodes and the opposite electrode to emit light.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
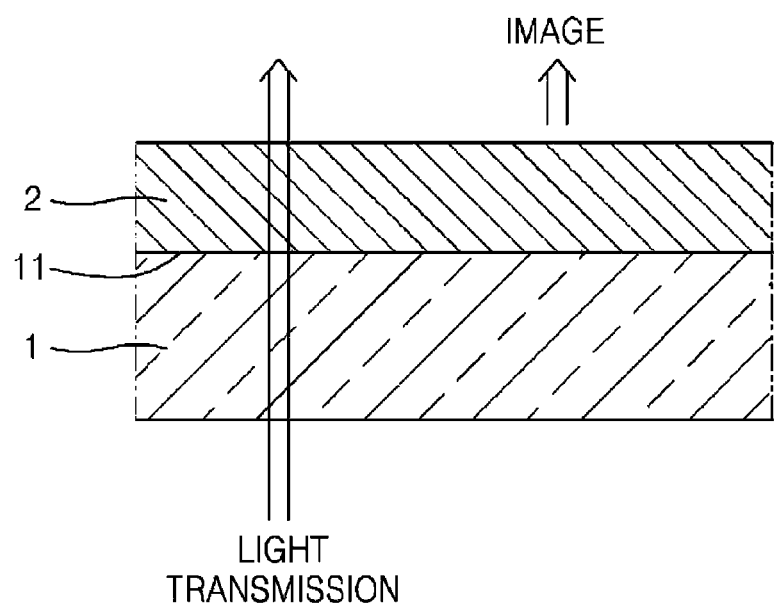
FIG. 1 is a cross-sectional view of an organic light emitting display device according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

FIG. 1 is a cross-sectional view of an organic light emitting display device according to an embodiment of the present invention. Referring to FIG. 1, the organic light emitting display device, according to an embodiment of the present invention, includes a display unit 2 formed on a first surface 11 of a substrate 1. In the organic light emitting display device, external light enters through the substrate 1 and the display unit 2.

As will be described later, the display unit 2 is formed to be able to transmit the external light. That is, referring to FIG. 1, the display unit 2 is formed so that a user positioned on a side of the display unit 2 where an image is displayed can observe an object on an other side of the display unit 2 outside the substrate 1.

Figure 2:
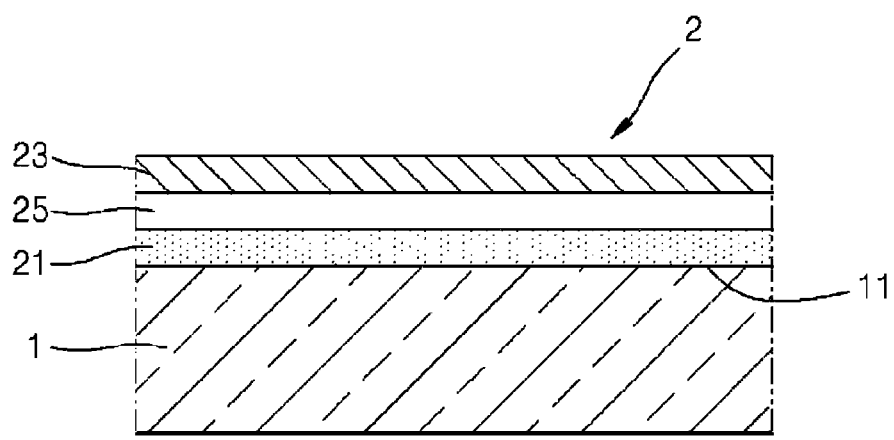
FIG. 2 is a cross-sectional view showing details of an embodiment of the organic light emitting display device of FIG. 1.

FIG. 2 is a cross-sectional view showing an embodiment of the organic light emitting display device of FIG. 1. The display unit 2 includes an organic light emitting unit 21 formed on the first surface 11 of the substrate 1 and a sealing substrate 23 sealing the organic light emitting unit 21. The sealing substrate 23 is formed of a transparent material allowing viewing of an image generated by the organic light emitting unit 21 and preventing external air and moisture from penetrating into the organic light emitting unit 21. Edges of the sealing substrate 23 and the organic light emitting unit 21 are sealed by a sealant (not shown), and thus, a space 25 is formed between the sealing substrate 23 and the organic light emitting unit 21. The space 25 is filled with an absorbent or a filler.

Figure 3:
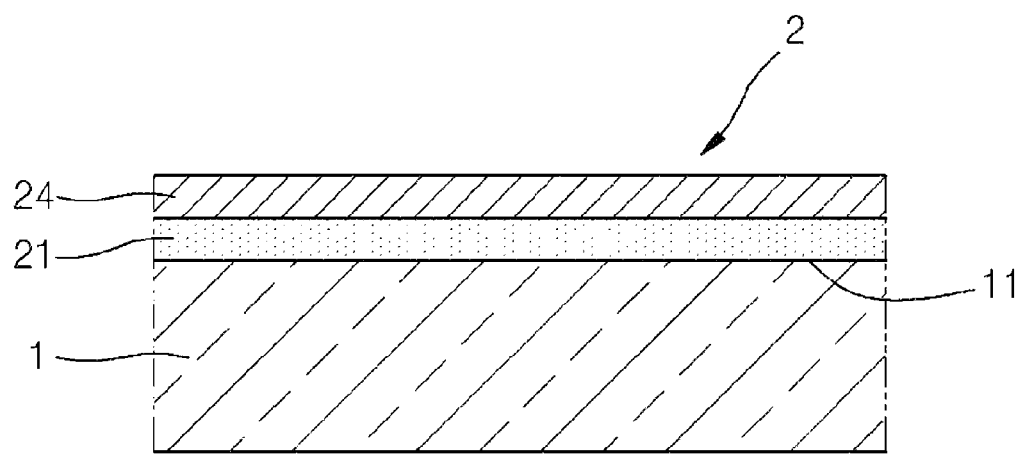
FIG. 3 is a cross-sectional view showing details of another embodiment of the organic light emitting display device of FIG. 1.

FIG. 3 is a cross-sectional view showing another embodiment of the organic light emitting display device of FIG. 1. As shown in FIG. 3, a thin sealing film 24 is formed on the organic light emitting unit 21 to protect the organic light emitting unit 21 from external air. The thin sealing film 24 has a structure in which a film formed of an inorganic material such as silicon oxide or silicon nitride and a film formed of an organic material such as epoxy or polyimide are alternately stacked. However, aspects of the present invention are not limited thereto, and the thin sealing film 24 may have any thin film type sealing structure.

Figure 4:
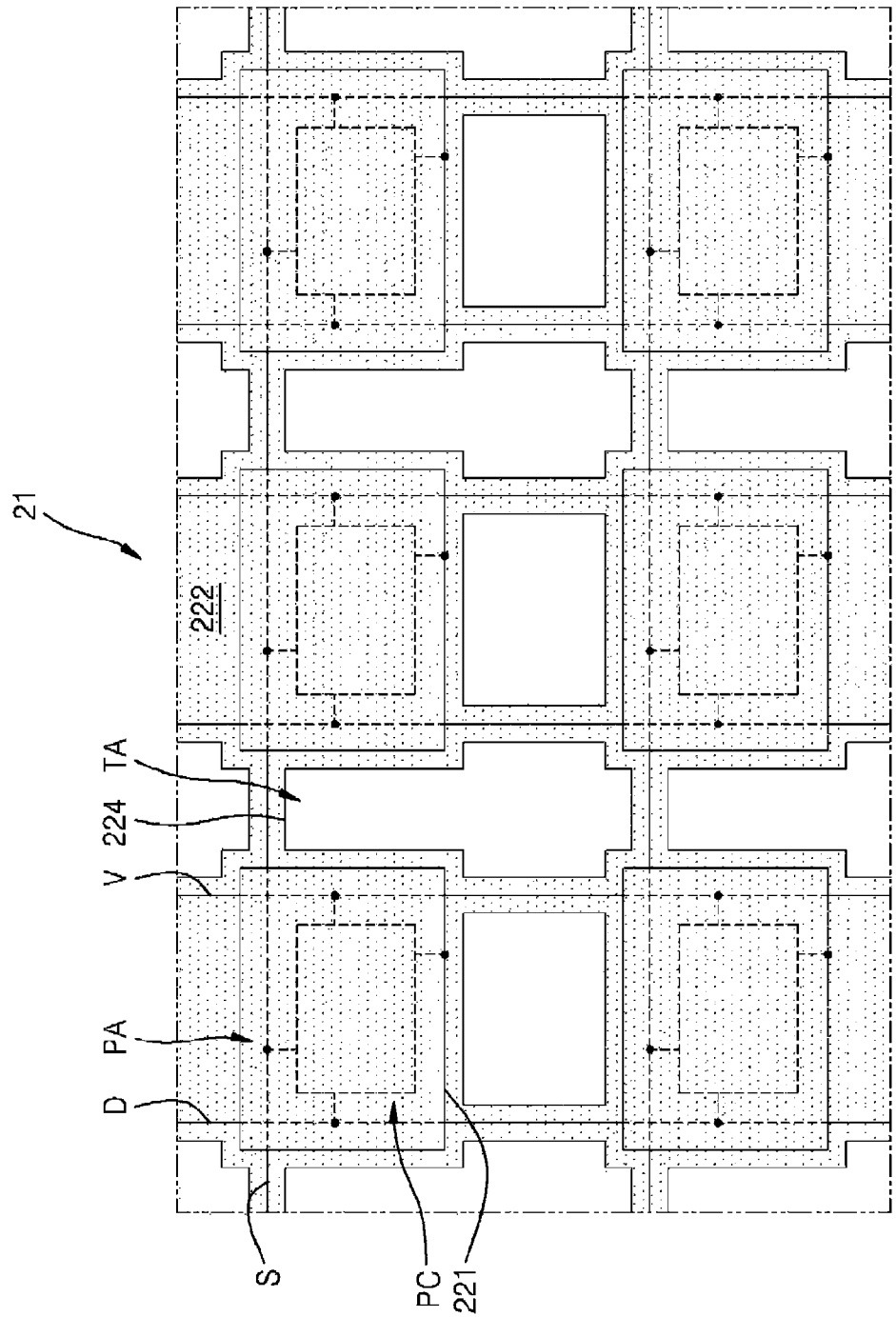
FIG. 4 is a schematic drawing showing an example of an organic light emitting unit of FIG. 2 or FIG. 3.
Figure 5:
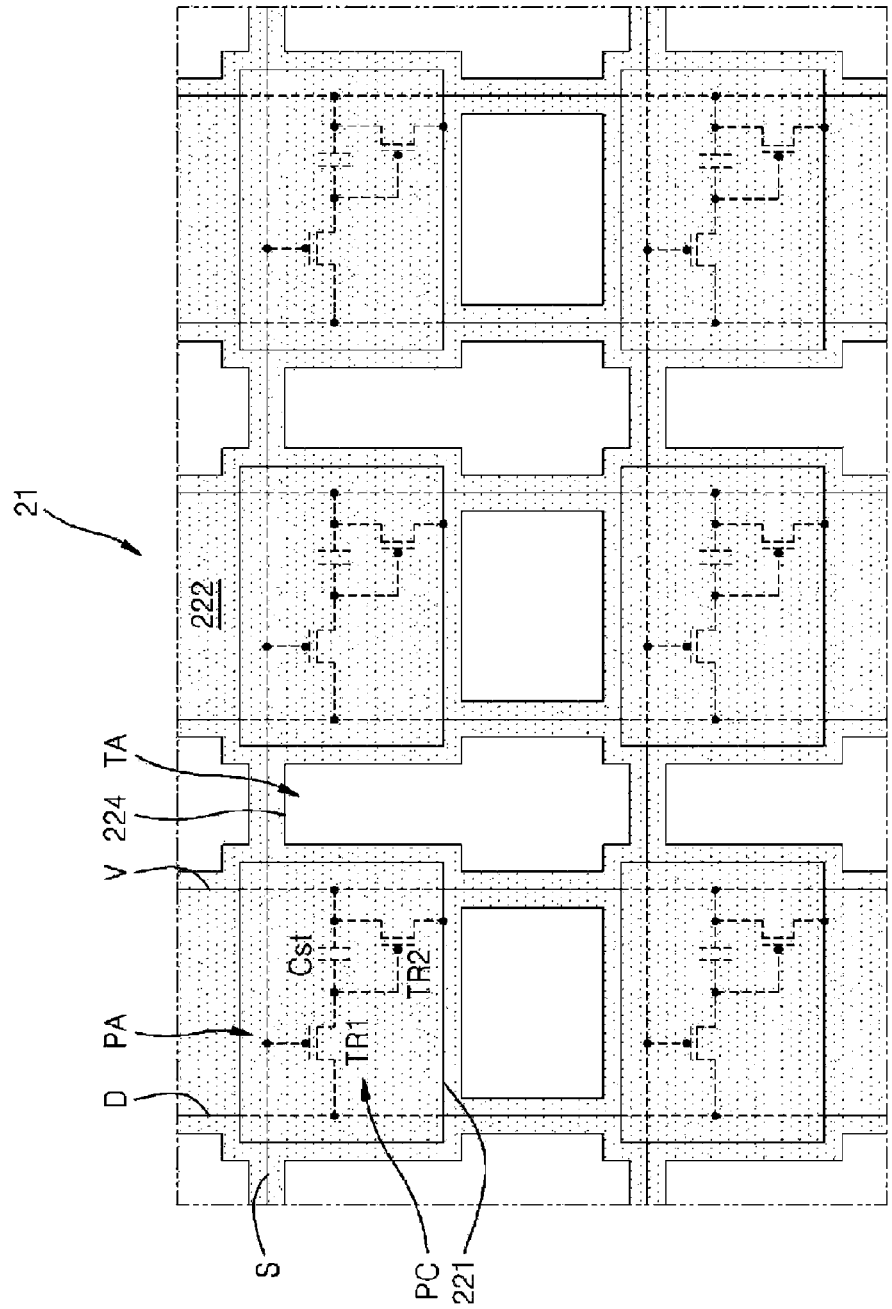
FIG. 5 is a schematic drawing of the organic light emitting unit including an example of a pixel circuit unit of FIG. 4.

FIG. 4 is a schematic drawing showing an example of the organic light emitting unit 21 of FIG. 2 or FIG. 3, and FIG. 5 is a schematic drawing of the organic light emitting unit 21 including an example of pixel circuit units PC of FIG. 4. Referring to FIGS. 2 through 4, according to an embodiment of the present invention, the organic light emitting unit 21 is formed on the substrate 1 on which transmitting regions TA transmitting external light are defined. Also, pixel regions PA separated from each other and having the transmitting regions TA interposed therebetween are defined on the substrate 1.

Each of the pixel regions PA includes one of the pixel circuit units PC, and a plurality of conductive lines, such as a scan line S, a data line D, and a driving power line V, are electrically connected to the pixel circuit unit PC. Although not shown, various other conductive lines besides the scan line S, the data line D, and the driving power line V may be connected to the pixel circuit unit PC according to a configuration of the pixel circuit unit PC.

As shown in FIG. 5, each pixel circuit unit PC includes a first thin film transistor TR1 connected to the scan line S and the data line D, a second thin film transistor TR2 connected to the first thin film transistor TR1 and the driving power line V, and a capacitor Cst connected to the first and second TFTs TR1 and TR2. The first TFT TR1 is a switching transistor and the second TFT TR2 is a driving transistor. The second TFT TR2 is electrically connected to a pixel electrode 221. In FIG. 5, the first and second TFTs TR1 and TR2 are P-type transistors. However, aspects of the present invention are not limited thereto, and at least one of the first and second TFTs TR1 and TR2 may be an N-type transistor. According to an embodiment of the present invention, all the conductive lines including the scan line S, the data line D, and the driving power line V are disposed to cross the pixel region PA, and no conductive lines cross only the transmitting regions TA.

The pixel regions PA are light emitting regions. Since the pixel circuit unit PC is located in the pixel regions PA and all the conductive lines, including the scan line S, the data line D, and the driving power line V, cross the light emitting regions, a user can see through the transmitting regions TA. As will be described later, since a portion of each of the scan line S, the data line D, and the driving power line V transits the transmitting regions TA, the area of a conductive pattern that is one of main factors causing lowering of the transmittance of the transparent organic light emitting display device is minimized. Thus, the transmittance of the transmitting regions TA is further increased.

In this way, a region where the image is displayed, is divided into the pixel regions PA and the transmitting regions TA, and a larger portion of the conductive patterns that is one of the main factors causing lowering of the overall transmittance of the transparent organic light emitting display device is disposed in the pixel regions PA rather than the transmitting regions TA in order to increase the transmittance of the transmitting regions TA. Thus, the transmittance of the regions displaying the image can be improved as compared to the transmittance of the regions displaying an image in a conventional transparent display device.

In addition, external image distortion occurring when the user observes the outside view through the transmitting regions TA in the region where the image is displayed. As described above, the region where the image is displayed is divided into the pixel regions PA and the transmitting regions TA, and thus, image distortion in the region due to scattering of solar light caused by interference with the patterns of internal devices of the pixel circuit unit PC can be prevented.

The conductive lines including scan line S, data line D, and driving power line V are disposed to cross the transmitting regions TA between the pixel regions PA. However, since the conductive lines are formed to be very thin, the conductive lines are hardly observed by the user and have little effect on the overall transmittance of the organic light emitting unit 21, and accordingly, a transparent display can be realized. Also, the user may not see as much of the external image in regions covered by the pixel regions PA as compared to in regions covered by the transmitting regions TA. However, in consideration of the overall display region, there is little effect on observing the external image since the pixel regions PA are like a plurality of dots regularly arranged on a surface of a transparent glass. Furthermore, the transmitting regions TA and the pixel regions PA are formed so that a ratio of an area of the transmitting regions TA with respect to an overall area of the transmitting regions TA and the pixel regions PA is between 20% and 90%.

With reference to FIG. 1, if the ratio of the area of the transmitting regions TA with respect to the overall area of the transmitting regions TA and the pixel regions PA is less than 20%, the user can hardly see an object or image on a side opposite to the user due to lack of light that transmits through the display unit 2 when the display 2 unit is in an off-state. In other words, the display unit 2 is not considered to be transparent. Although the ratio of the area of the transmitting regions TA with respect to the overall area of the transmitting regions TA and the pixel regions PA may be approximately 20%, the pixel regions PA are present in an island state with respect to the transmitting regions TA, and scattering of solar light is minimized because all conductive patterns are disposed across the pixel regions PA. Thus, the display unit 2, according to the present embodiment of the present invention, is considered to be a transparent display unit by the user. As will be described later, when a transistor included in the pixel circuit unit PC is formed of a transparent thin film transistor (TFT) such as an oxide semiconductor and an organic light emitting device is a transparent device, the display unit 2 is considered to be a transparent display unit.

If the ratio of the area of the transmitting regions TA with respect to the entire area of the pixel regions PA and the transmitting regions TA is greater than 90%, pixel integrity of the display unit 2 is excessively reduced, and thus, a stable image is difficult to be realized through the light emission from the pixel regions PA. That is, as the area of the pixel regions PA is reduced, the amount of light emitted from an organic emission layer must be increased in order to realize an image. However, if the organic light emitting device is operated to emit light having a high brightness, the lifetime of the organic light emitting device is rapidly reduced. Also, when the ratio of the area of the transmitting regions TA with respect to the entire are of the pixel regions PA and the transmitting regions TA is greater than 90% while the size of a single pixel region PA is maintained at an appropriate size, the number of pixel regions PA is reduced, and accordingly, the resolution of the organic light emitting device is reduced.

However, aspects of the present invention are not limited to the above mentioned ratios and the ratio of the area of the transmitting regions TA with respect to the entire area of the pixel regions PA and the transmitting regions TA may further be in a range of 40% to 70%. When the ratio of the area of the transmitting regions TA with respect to the entire area of the pixel regions PA and the transmitting regions TA is less than 40%, the ratio of the area of the pixel regions PA with respect to the area of the transmitting regions TA is excessively increased. Therefore, the user is limited in observing an external image through the transmitting regions TA. When the ratio of area of the transmitting regions TA with respect to the entire area of the pixel regions PA and the transmitting regions TA exceeds 70%, there are limitations in designing the pixel circuit unit PC as discussed above.

Each of the pixel regions PA includes the pixel electrode 221 that has an area corresponding to the area of pixel regions PA and which is electrically connected to the pixel circuit unit PC. The pixel circuit unit PC overlaps with the pixel electrode 221 so that the pixel circuit unit PC is covered by the pixel electrode 221. Also, the conductive lines, including the scan line S, the data line D, and the driving power line V, are disposed to cross the pixel electrode 221. According to an embodiment of the present invention, the pixel electrode 221 has an area equal to or slightly greater than that of the pixel region PA. However, aspects of the present invention are not limited thereto, and the pixel regions PA may have other areas. Additionally, a first opening 224 is formed adjacent to respective ones of the pixel regions PA and at a location corresponding to at least a portion of respective ones of the transmitting regions TA and an opposite electrode 222 is formed on the pixel electrode 221.

Figure 6:
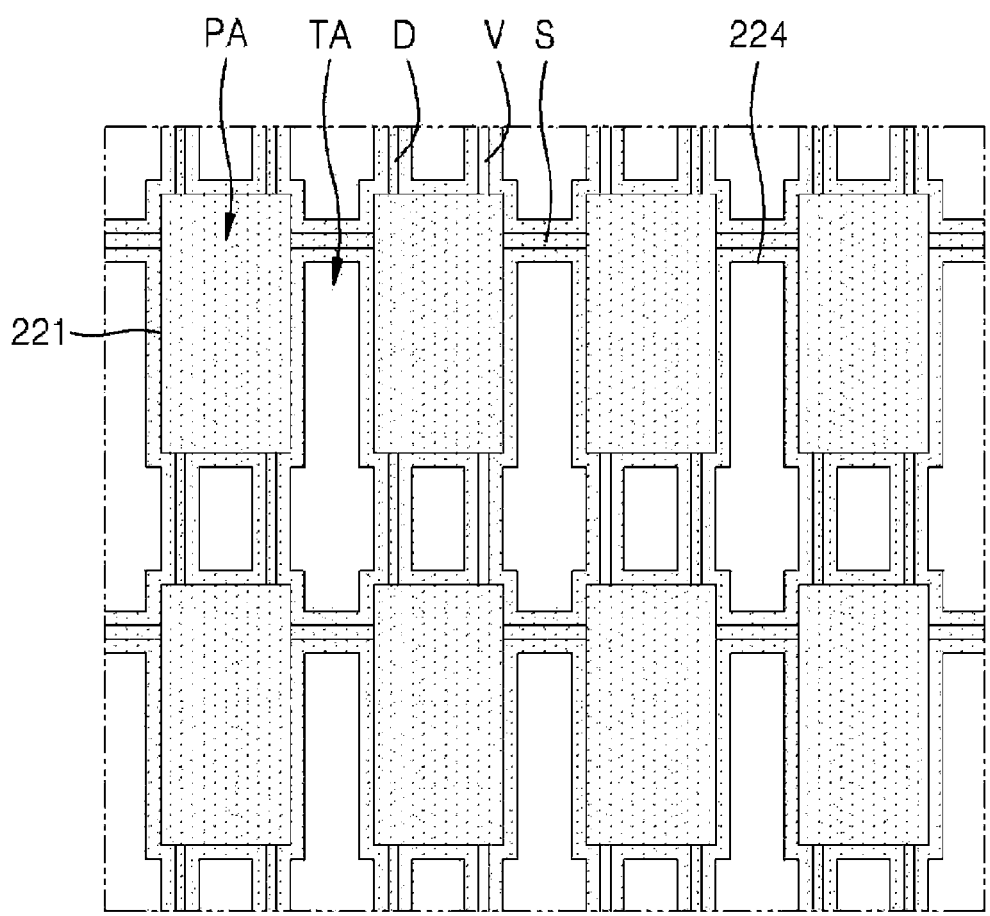
FIG. 6 is a plan view specifically showing an example of the organic light emitting unit of FIG. 5.

Accordingly, as shown in FIG. 6, when the user views the organic light emitting unit 21, the pixel circuit unit PC described above is covered by the pixel electrode 221 and a large portion of the conductive lines are also covered. Therefore, since the user sees only a portion of the conductive lines through the transmitting regions TA, the overall transmittance of the transparent organic light emitting display device is improved as described above and thus, the user can see an external image through the transmitting regions TA. In order to further increase the transmittance of external light in the transmitting regions TA, a first opening 224 is formed in an opposite electrode 222 on a location corresponding to at least a portion of the transmitting regions TA. This will be described later.

Figure 7:
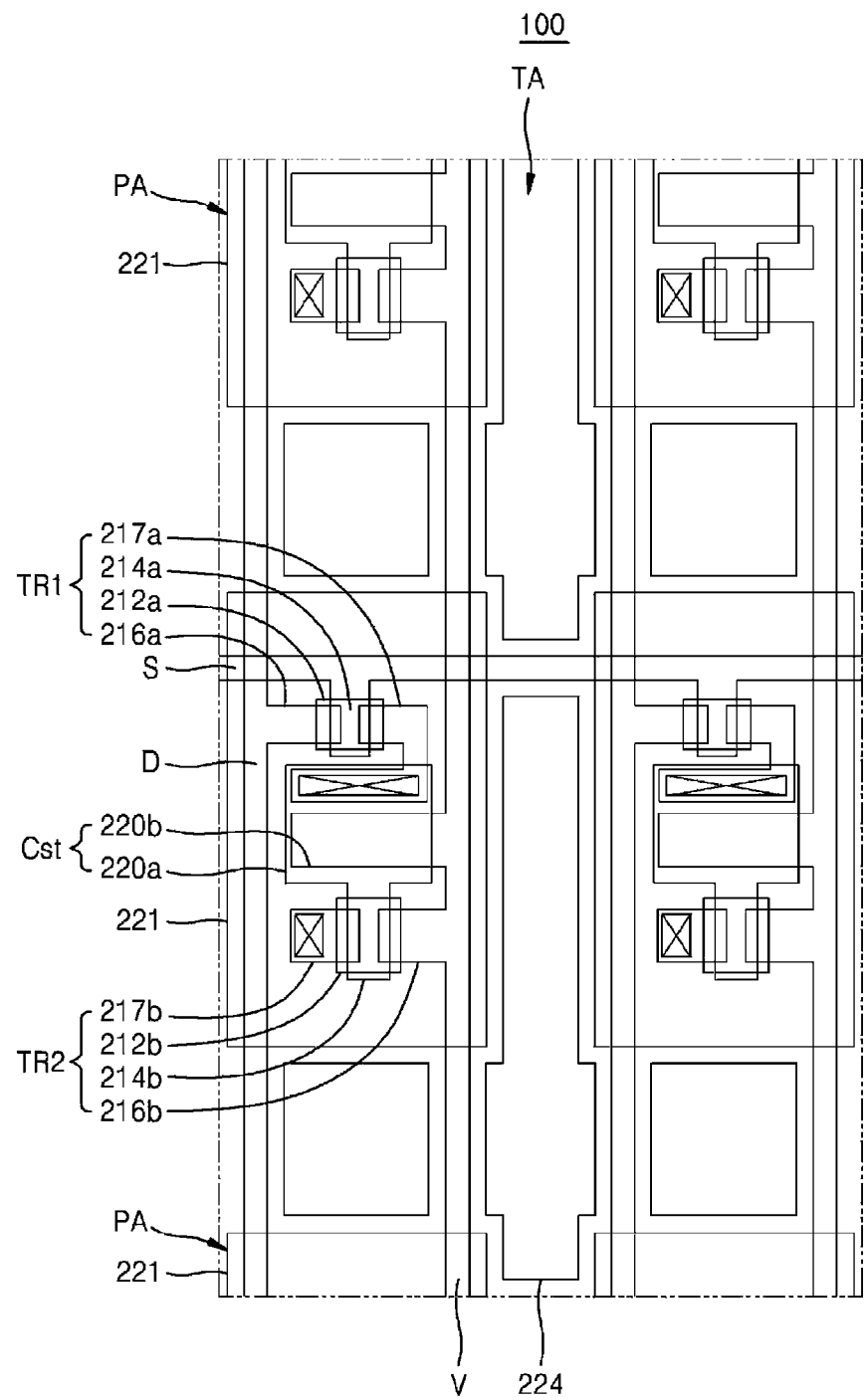
FIG. 7 is a plan view specifically showing detailed example of the organic light emitting unit of FIG. 5.
Figure 8:
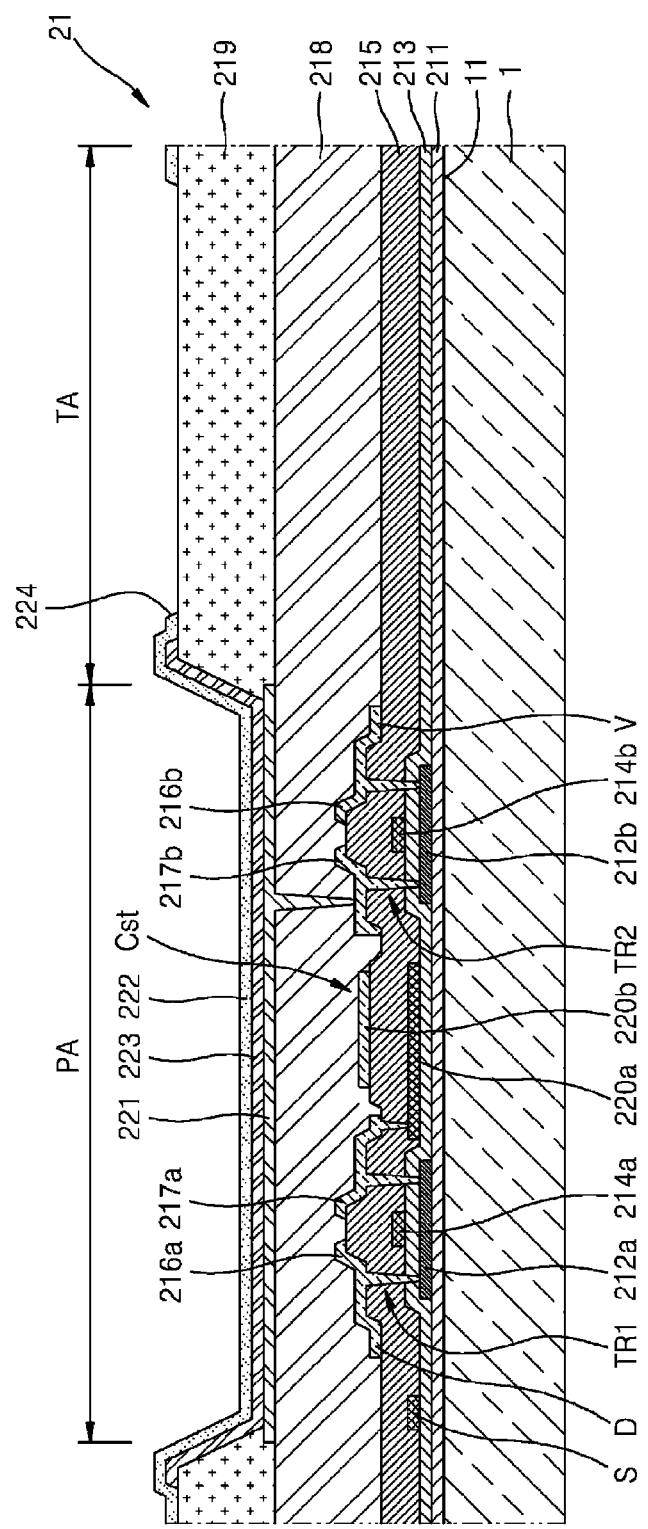
FIG. 8 is a cross-sectional view of an organic light emitting display device according to another embodiment of the present invention.

FIGS. 7 and 8 are a plan view and a cross-sectional view respectively showing an example of the organic light emitting unit 21 of FIG. 5, illustrating the pixel circuit unit PC of FIG. 5 in detail. According to an embodiment of the present invention, in the organic light emitting unit 21 of FIGS. 7 and 8, a buffer layer 211 is formed on the first surface 11 of the substrate 1, and a first thin film transistor (TFT) TR1, a capacitor Cst, and a second thin film transistor (TFT) TR2 are formed on the buffer layer 211. A first semiconductor active layer 212a and a second semiconductor active layer 212b are formed on the buffer layer 211.

The buffer layer 211 prevents impurity elements from penetrating into the organic light emitting unit 21 and planarizes a surface of the organic light emitting unit 21. The buffer layer 211 is formed of any of various materials that can perform the functions described above. For example, the buffer layer 211 is formed of an inorganic material such as silicon oxide, silicon nitride, silicon oxynitride, aluminum oxide, aluminum nitride, titanium oxide, or titanium nitride, an organic material such as polyimide, polyester, or acryl, or stacks of these materials. However, aspects of the present invention are not limited thereto, and the buffer layer 211 may be formed of other suitable materials, and also, the buffer layer 211 is not an essential element, and may not be formed.

The first and second semiconductor active layers 212a and 212b are formed of polycrystal silicon. However, aspects of the present invention are not limited thereto, and the first and second semiconductor active layers 212a and 212b may be formed of an oxide semiconductor or other suitable materials. For example, the first and second semiconductor active layers 212a and 212b may be G-I-Z-O layers [$(In_2O_3)_a(Ga_2O_3)_b(ZnO)_c$ layer](where a, b, and c are integers that respectively satisfy a≧0, b≧0, and c>0). When the first and second semiconductor active layers 212a and 212b are formed of an oxide semiconductor, optical transmittance can further be increased compared to when the first and second semiconductor active layers 212a and 212b are formed of polycrystal silicon.

A gate insulating layer 213 covering the first and second semiconductor active layers 212a and 212b is formed on the buffer layer 211. First and second gate electrodes 214a and 214b are formed on the gate insulating layer 213. An interlayer insulating layer 215 is formed on the gate insulating layer 213 to cover the first and second gate electrodes 214a and 214b. A first source electrode 216a and a first drain electrode 217a and a second source electrode 216b and a second drain electrode 217b are each formed on the interlayer insulating layer 215, and are respectively connected to the first semiconductor active layer 212a and the second semiconductor active layer 212b through contact holes.

A scan line S is simultaneously formed with the first and second gate electrodes 214a and 214b. The data line D is simultaneously formed with the first source electrode 216a and connected to the first source electrode 216a. The driving power line V is simultaneously formed with the second source electrode 216*b* and is connected to the second source electrode 216*b*. In a capacitor Cst, a lower electrode 220*a* is simultaneously formed with the first and second gate electrodes 214*a* and 214*b*, and an upper electrode 220*b* is simultaneously formed with the first drain electrode 217*a*. However, aspects of the present invention are not limited thereto and the structures of the first TFT TR1, the capacitor Cst, and the second TFT TR2 may have various types of TFT and capacitor structures.

A passivation layer 218 is formed to cover the first TFT TR1, the capacitor Cst, and the second TFT TR2. The passivation layer 218 is a single layer or multiple layers of an insulating layer, an upper surface of which is planarized, and is formed at least one of an inorganic material and an organic material.

A pixel electrode 221 covering the first TFT TR1, the capacitor Cst, and the second TFT TR2 is formed on the passivation layer 218, as shown in FIGS. 7 and 8. The pixel electrode 221 is connected to the second drain electrode 217*b* of the second TFT TR2 through a via hole formed in the passivation layer 218. As shown in FIG. 7, the pixel electrode 221 is formed as an island type independent from other ones of a plurality of pixel electrodes 221.

A pixel defining layer 219 covering edges of the pixel electrode 221 is formed on the passivation layer 218. An organic emission layer 223 and an opposite electrode 222 are sequentially formed on the pixel electrode 221. The opposite electrode 222 is formed on all the pixel regions PA and the transmitting regions TA.

The organic emission layer 223 is a low molecular weight organic film or a polymer organic film. When the organic emission layer 223 is a low molecular weight organic film, the organic emission layer 223 is formed by stacking a hole injection layer (HIL), a hole transport layer (HTL), an emission layer (EML), an electron transport layer (ETL), and an electron injection layer (EIL) in a single structure or a composite structure. The organic emission layer 223 is formed of any of various materials such as copper phthalocyanine (CuPc), N,N'-Di(naphthalene-1-yl)-N,N'-diphenyl-benzidine (NPB), or tris-8-hydroxyquinoline aluminum (Alq3). The low molecular weight organic film is formed by vacuum deposition. However, aspects of the present invention are not limited thereto, and the organic emission layer 223 may be formed of other suitable material and may be formed by other suitable processes. The HIL, the HTL, the ETL, and the EIL are common layers and are commonly applied to red, green, and blue pixels. Accordingly, unlike the organic emission layer 223 in FIG. 7, according to the present embodiment, the common layers is formed to cover the pixel regions PA and the transmitting regions TA similar to the opposite electrode 222.

The pixel electrode 221 functions as an anode electrode, and the opposite electrode 222 functions as a cathode electrode. However, aspects of the present invention are not limited thereto, and the polarities of the pixel electrode 221 and the opposite electrode 222 may be reversed. The pixel electrode 221 is a reflection electrode and the opposite electrode 222 is a transparent electrode. The pixel electrode 221 includes a reflection film formed of silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or a compound of these materials, or an oxide having a high work function such as ITO, IZO, ZnO, or $In_2O_3$. The opposite electrode 222 is formed of a metal having a low work function such as Ag, Mg, Al, Pt, Pd, Au, Ni, Nd, Ir, Cr, Li, or Ca. Accordingly, the organic light emitting unit 21 is a top emission type in which an image is displayed in a direction towards the opposite electrode 222. However, aspects of the present invention are not limited thereto and the pixel electrode 221 and the opposite electrode 222 may be formed of other suitable materials.

When the pixel electrode 221 is a reflection electrode, a pixel circuit unit PC disposed under the pixel electrode 221 is covered by the pixel electrode 221. Therefore, referring to FIG. 7, at upper outer sides of the opposite electrode 222, the user cannot view the first TFT TR1, the capacitor Cst, and the second TFT TR2 disposed under the pixel electrode 221, as well as portions of the scan line S, the data line D, and the driving power line V. As the pixel electrode 221 is the reflection electrode, light is emitted only towards the user. Thus, an amount of light lost in a direction opposite to a direction of the user can be reduced. Also, since the pixel electrode 221 covers various patterns of the pixel circuit unit PC disposed under the pixel electrode 221, as described above, the user can see a clearer external image.

However, aspects of the present invention are not limited thereto, and, for example, the pixel electrode 221 can also be a transparent electrode. In such a case, the pixel electrode 221 is formed of an oxide having a high work function, such as ITO, IZO, ZnO, or $In_2O_3$. If the pixel electrode 221 is transparent, at upper outer sides of the opposite electrode 222, the user can observe the first TFT TR1, the capacitor Cst, and the second TFT TR2 disposed under the pixel electrode 221, as well as portions of the scan line S, the data line D, and the driving power line V. However, although the pixel electrode 221 is transparent, there is a loss of light since the transmittance of light therethrough cannot be 100%, and the transmittance of external light is further reduced due to the pixel electrode 221 because the conductive patterns are disposed in a region of the pixel electrode 221. Therefore, interference due to the conductive patterns on the external light is reduced as compared to when the external light directly enters the conductive patterns, thereby reducing distortion of an external image.

The passivation layer 218, the gate insulating layer 213, the interlayer insulating layer 215, and the pixel defining layer 219 are formed as transparent insulating layers. The substrate 1 has a transmittance greater or equal to the total transmittance of the transparent insulating layers. The passivation layer 218 is also referred to as a first insulating layer, and the gate insulating layer 213, the interlayer insulating layer 215, and the pixel defining layer 219 are also referred to as a second insulating layer.

According to aspects of the present invention, in order to further increase the optical transmittance of the transmitting regions TA, a first opening 224 is formed in the opposite electrode 222 on a location corresponding to at least a portion of the transmitting regions TA. As described above, in order to increase transmittance of external light of the transmitting regions TA, the area of the transmitting regions TA is increased, or the transmittance of material formed in the transmitting regions TA is increased. However, when the area of the transmitting regions TA is increased, there are limitations due designing the pixel circuit unit PC and thus, the transmittance of the material formed in the transmitting regions TA is increased.

Although the organic light emitting unit 21 is a top emission type in which an image is displayed in a direction towards the opposite electrode 222, the opposite electrode 222 is formed of metal and thus, there are limitations in light transmission. When the thickness of the opposite electrode 222 is reduced or the opposite electrode 222 is formed of a conductive metal oxide material having a high transmittance, the resistance of the opposite electrode 222 is excessively increased and thus, reducing the thickness of the opposite electrode 222 or forming the opposite electrode 222 of the conductive metal oxide material having a high transmittance is not a preferred method. According to aspects of the present invention, in order to overcome these problems, the first opening 224 is formed in the opposite electrode 222, thereby improving transmittance of external light in the transmitting regions TA.

According to aspects of the present invention, a planar pattern of the first opening 224 is not limited to the examples of FIGS. 4 through 7, and the first opening 224 may be formed in various patterns in the transmitting regions TA. For example, the first opening 224 may be formed in the shape of a channel that extends in a straight line in a horizontal direction along the transmitting regions TA or in the shape of a channel that extends in a straight line in a vertical direction along the transmitting regions TA. Also, the first opening 224 may be patterned in the form of dots in a portion of the transmitting regions TA.

Figure 9:
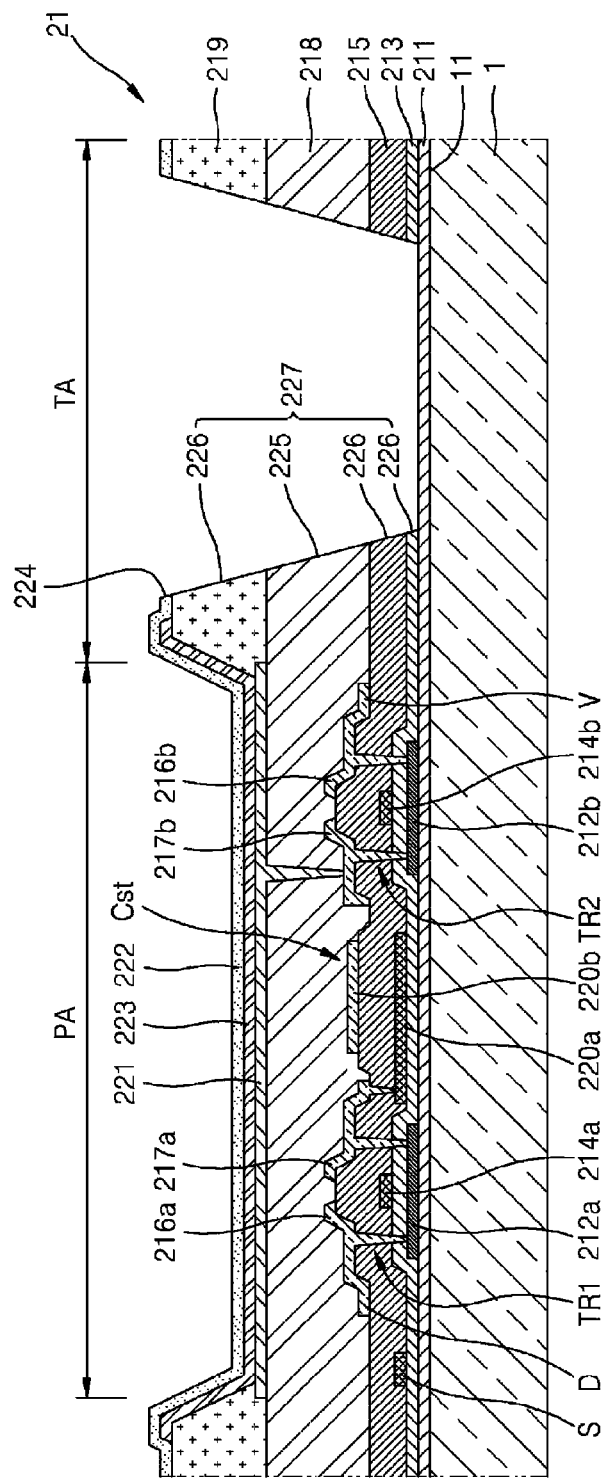
FIG. 9 is a cross-sectional view of an organic light emitting display device according to another embodiment of the present invention.

FIG. 9 is a drawing showing another embodiment of the organic light emitting unit of FIG. 5, and shows a additional second through fourth openings 225-227 formed in the transparent insulating layers in the transmitting regions TA. The second through fourth openings 225-227 are formed as wide as possible as long as the second through fourth openings 225-227 do not interrupt the scan line S, the data line D, and the driving power line V, and are formed to be connected to the first opening 224. However, aspects of the present invention are not limited thereto and the second through fourth openings 225-227 may have other suitable widths.

A second opening 225 is formed in the passivation layer 218 covering the pixel circuit unit PC, and a third opening 226 is formed in the gate insulating layer 213, the interlayer insulating layer 215, and the pixel defining layer 219. The second opening 225 and the third opening 226 constitute a fourth opening 227.

In FIG. 9, the fourth opening 227 does not extend into the buffer layer 211 in order to prevent impurities from penetrating into the substrate 1. However aspects of the present invention are not limited thereto, and the fourth opening 227 may extend into the buffer layer 211. If necessary, the fourth opening 227 may extend up to the buffer layer 211. In this way, the formation of the fourth opening 227, as well as the first opening 224 in the transmitting regions TA, further increases the optical transmittance of the transmitting regions TA, and thus, an external image is more clearly observed by the user.

As described above, according to aspects of the present invention, an organic light emitting display device in which transmittance of external light is increased so that increased visibility of an external image is obtainable. Furthermore, a transparent organic light emitting display device that prevents distortion of an image transmitted therethrough by preventing light transmitting therethrough from scattering is obtainable.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An organic light emitting display device comprising:
   a substrate having transmitting regions interposed between pixel regions of the substrate;
   thin film transistors positioned on a first surface of the substrate and respectively disposed in the pixel regions of the substrate;
   a passivation layer covering the thin film transistors;
   pixel electrodes formed on the passivation layer and respectively electrically connected to the thin film transistors, the pixel electrodes are respectively located in an area corresponding to the pixel regions and are disposed to respectively overlap and cover the thin film transistors;
   an opposite electrode facing the pixel electrodes and formed to be able to transmit light, the opposite electrode is located in the transmitting regions and the pixel regions and includes first openings formed on locations corresponding to at least a portion of respective ones of the transmitting regions; and
   an organic emission layer interposed between respective ones of the pixel electrodes and the opposite electrode to emit light.

2. The organic light emitting display device of claim 1, wherein the pixel electrode has an area identical to that of one of the pixel regions.

3. The organic light emitting display device of claim 1, further comprising conductive lines respectively electrically connected to the thin film transistors, wherein all of the conductive lines are arranged to overlap respective ones of the pixel electrodes.

4. The organic light emitting display device of claim 1, wherein a ratio of an area of the transmitting region with respect to a total area of the pixel regions and the transmitting region is between 20% and 90%.

5. The organic light emitting display device of claim 1, wherein the passivation layer is formed on both the transmitting regions and the pixel regions and is formed of a transparent material.

6. The organic light emitting display device of claim 5, wherein the substrate has a transmittance greater than or equal to a transmittance of the passivation layer.

7. The organic light emitting display device of claim 1, wherein the passivation layer is formed on both the transmitting regions and the pixel regions and comprises a second opening on a location corresponding to at least a portion of respective ones of the transmitting regions.

8. The organic light emitting display device of claim 7, wherein the second opening is connected to the first opening.

9. The organic light emitting display device of claim 1, wherein insulating layers are formed on a location corresponding to the transmitting region, and the insulating layers comprise a third opening on a location corresponding to at least a portion of the transmitting region.

10. The organic light emitting display device of claim 9, wherein the third opening is connected to the first opening.

11. The organic light emitting display device of claim 1, wherein at least one of the pixel electrodes and the opposite electrode is a transparent electrode.

12. The organic light emitting display device of claim 1, wherein the opposite electrode is plural in number.

13. An organic light emitting display device comprising:
   a substrate having transmitting regions interposed between pixel regions of the substrate;
   pixel circuit units formed on a first surface of the substrate in the pixel regions, respectively, each of the pixel circuit units having at least one thin film transistor;
   a first insulating layer covering the pixel circuit units;

pixel electrodes formed on the first insulating layer and respectively electrically connected to the pixel circuit units while overlapping and covering the pixel circuit units respectively;

an opposite electrode facing the pixel electrodes and formed to be able to transmit light, the opposite electrode is located in the transmitting regions and the pixel regions and includes first openings formed on locations corresponding to at least a portion of respective ones of the transmitting regions; and an organic emission layer interposed between respective ones of the pixel electrodes and the opposite electrode to emit light.

14. The organic light emitting display device of claim 13, wherein the pixel electrode has an area identical to that of one of the pixel regions.

15. The organic light emitting display device of claim 13, further comprising conductive lines respectively electrically connected to the pixel circuit units, wherein the conductive lines are arranged to cross respective ones of the pixel regions.

16. The organic light emitting display device of claim 13, wherein a ratio of an area of the transmitting regions with respect to a total area of the pixel regions and the transmitting regions is between 20% and 90%.

17. The organic light emitting display device of claim 16, wherein the substrate has a transmittance greater than or equal to a total transmittance of the first insulating layer and the second insulating layers.

18. The organic light emitting display device of claim 13, wherein the transmitting regions and the pixel regions each comprise a first insulating layer and second insulating layers, and the first insulating layer and the second insulating layers are formed of a transparent material.

19. The organic light emitting display device of claim 13, wherein the transmitting region and the pixel regions each comprise the first insulating layer and a plurality of second insulating layers, and at least one of the first insulating layer and the second insulating layers include a fourth opening corresponding to the transmitting region.

20. The organic light emitting display device of claim 19, wherein the fourth opening is connected to the first opening.

21. The organic light emitting display device of claim 13, wherein at least one of the pixel electrode and the opposite electrode is a transparent electrode.

22. The organic light emitting display device of claim 13, wherein the opposite electrode is plural in number.

23. An organic light emitting unit comprising:
a substrate;
pixel regions disposed on the substrate, comprising:
  pixel circuits respectively disposed in the pixel regions; and
  pixel electrodes respectively disposed above corresponding ones of the pixel circuits and electrically connected to the corresponding ones of the pixel circuits;
transmitting regions disposed between at least two corresponding ones of the pixel regions;
a passivation layer disposed on the pixel circuits and the pixel electrodes;
an opposite electrode disposed in the transmitting regions and the pixel regions and including the first openings formed at locations corresponding to at least a portion of respective ones of the transmitting regions; and
organic emission layers interposed between the pixel electrodes and the opposite electrode to emit light,
wherein the first openings pass through the passivation layer.
first openings disposed above respective ones of the transmitting regions.

24. The organic light emitting unit of claim 23, further comprising:
data lines extending in a first direction and traversing respective portions of the pixel electrodes adjacent to each other in the first direction;
driving power lines extending in the first direction and traversing under the respective portions of the pixel electrodes; and
scan lines extending in a second direction perpendicular to the first direction and traversing under other respective portions of the pixel electrodes adjacent to each other in the second direction,
wherein the scan lines extend between at least two corresponding ones of the transmitting regions adjacent to each other in the first direction.

25. The organic light emitting unit of claim 23, wherein each of the pixel circuits comprise:
a first thin film transistor (TFT) having a first end connected to corresponding ones of the data lines, a second end connected to a first node and a gate connected to corresponding ones of the scan lines;
a second TFT having a first end connected to corresponding ones of the driving power lines, a second end connected to corresponding ones of the pixel electrodes and a gate connected to the first node; and
a capacitor connected between the first node and the corresponding ones of the driving power lines.

26. The organic light emitting unit of claim 23, wherein each of the pixel electrodes has an area identical to that of a respective one of the pixel regions.

27. The organic light emitting unit of claim 23, wherein a ratio of an area of a respective one of the transmitting regions with respect to a total area of a respective one of the pixel regions and the respective one of the transmitting regions is between 20% and 90%.

28. The organic light emitting unit of claim 23, wherein the passivation layer is formed on both the transmitting regions and the pixel regions and is formed of a transparent material.

29. The organic light emitting unit of claim 23, wherein the substrate has a transmittance greater than or equal to a transmittance of the passivation layer.

30. The organic light emitting unit of claim 23, wherein the passivation layer is formed on both the transmitting regions and the pixel regions,
wherein the passivation layer includes second openings at locations corresponding to at least a portion of respective ones of the transmitting regions, and
wherein the second openings are connected to respective ones the first openings.

31. The organic light emitting unit of claim 23, wherein insulating layers are formed on locations corresponding to the transmitting regions,
wherein the insulating layers comprise third openings on locations corresponding to at least a portion of respective ones of the transmitting regions, and
wherein the third openings are connected to respective ones of the first openings.

* * * * *